(12) United States Patent
Houdek (10) Patent No.: US 6,406,257 B1
(45) Date of Patent: Jun. 18, 2002

(54) MODULAR AIR MOVING SYSTEM AND METHOD

(75) Inventor: Philip J. Houdek, Los Gatos, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/408,769

(22) Filed: Sep. 29, 1999

(51) Int. Cl.[7] ............................................. F01D 25/26
(52) U.S. Cl. ................................... 415/213.1; 454/184
(58) Field of Search ...................... 454/184; 415/213.1; 312/236; 361/688, 690, 694, 695

(56) References Cited

U.S. PATENT DOCUMENTS

| 3,776,122 A | * | 12/1973 | Julian ........................ 454/184 |
| 4,744,005 A | * | 5/1988 | Milani ........................ 361/384 |
| 4,751,872 A | * | 6/1988 | Lawson, Jr. ................. 361/384 |
| 4,899,254 A | * | 2/1990 | Ferchau et al. ............. 361/384 |
| 5,308,156 A | * | 5/1994 | Gutierrez .................... 312/236 |
| 5,562,410 A | * | 10/1996 | Sachs et al. ............. 415/213.1 |
| 5,999,403 A | * | 12/1999 | Neustadt .................... 361/695 |
| 6,075,698 A | * | 6/2000 | Hogan et al. ............... 361/695 |

* cited by examiner

Primary Examiner—Pamela Wilson
Assistant Examiner—Derek S. Boles
(74) Attorney, Agent, or Firm—Schwegman, Lundberg, Woessner & Kluth, P.A.

(57) ABSTRACT

A system and method of cooling heat generating components. Heat generating components are placed in an enclosure having an air permeable cover. A mating panel having a mating connector is placed proximate to the air permeable cover. A fan assembly having a hub is coupled to the mating panel, wherein coupling includes wiring the fan to a fan connector, mounting the fan connector along an axial line running through the hub and pressing the fan assembly into the mating panel so as to mate the mating connector and the fan connector.

21 Claims, 6 Drawing Sheets

MODULAR AIR MOVING SYSTEM AND METHOD

FIELD OF THE INVENTION

The present invention is related to system cooling, and more particularly to a system and method for directing air through a system to be cooled.

BACKGROUND OF THE INVENTION

Modern electronics systems can generate a great deal of heat in a very small space. Such systems must be cooled in order to dissipate the heat.

Systems to date have used a variety of liquid and air cooling techniques to draw heat away from the electronic system. Liquid cooling systems tend to be complicated, requiring complex plumbing and heat exchange systems. They have, therefore, traditionally been used only on relatively large, expensive systems.

Air cooling, on the other hand, has been used on computers ranging from personal computers and laptops through minicomputer and mainframe systems. The benefits of air cooling are that air is relatively easy to move around a system and that air can be cooled using room or area air conditioners.

Air cooling systems typically use fans or other air moving devices to push air across components of the system being cooled. The fans are typically mounted inside of the system being cooled and either suck air through or push air into the device to be cooled. Since the fan is mounted inside the system, mechanical and electrical hazards must be eliminated by shutting down the system before a failed or failing fan can be replaced. Also, because of electrical danger, maintenance is normally performed by qualified technicians only.

In high density systems, large volumes of air are needed to ensure that an adequate amount of heat is removed from the system. Modern electronics systems tend to pack devices in smaller and smaller spaces, increasing the heat generated per unit volume. Failure to supply adequate amounts of air can result in overheating, leading to system error or failure. Therefore it is important to predict when a fan is going to fail, identify a failure immediately, and minimize the time needed for fan replacement in order to limit the effects of a fan failure.

Thus, what is needed is a system and method for efficiently directing air past components of a heat generating system in a way that reduces downtime due to fan failure while at the same time transferring adequate amounts of air through an electronics enclosure.

SUMMARY OF THE INVENTION

The present invention provides a system and method of cooling heat generating components. Heat generating components are placed in an enclosure having an air permeable cover. A mating panel having a mating panel connector is placed proximate to the air permeable cover. A fan assembly having a hub is coupled to the mating panel, wherein coupling includes wiring the fan to a fan connector, mounting the fan connector along an axial line running through the hub and pressing the fan assembly into the mating panel so as to mate the mating panel connector and the fan connector.

Another aspect of the present invention provides an air moving system which includes a fan assembly having a fan with a connector coupled to the fan. The fan assembly also includes one or more guide pins configured to guide the fan connector into a mating connection.

In further embodiments, the mating connection includes a panel connector situated in a central portion of a mating panel, the fan connector removably couplable with the panel connector.

In yet further embodiments, the fan assembly includes a rear finger guard for covering a rear side of the fan, with the one or more guide pins integral to the rear finger guide. The fan assembly includes a front finger guard for covering a front side of the fan, the front finger guard having handle. The handle includes a set of snap clips on each end of the handle, and wherein the front finger guard includes a modified H-shaped section couplable with the set of snap clips.

Another aspect of the present invention provides a cooling system. The cooling system includes an enclosure having an air permeable cover, a mating panel mounted proximate the air permeable cover and a fan assembly. The mating panel includes a mating connector or panel connector. The fan assembly includes a fan, a fan connector coupled to the fan and guiding members for guiding the fan assembly into the mating panel such that the fan connector and the panel connector are connected.

In a further embodiment, the cooling system includes a fan enclosure unit coupled proximate to the box, the mating panel mounted within the enclosure. In yet a further embodiment, the cooling system includes a controller for sensing and displaying fan and other system information.

The present system provides a modular system and method for efficiently directing air past components of a heat generating system. The system permits fan replacement by non-technical workers, permits fan replacement while the electronics system is still running, and permits a required volume of air movement in a minimal space. The result is increased reliability, reduced cost, and enhanced ease of use.

DESCRIPTION OF THE PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit of reference numbers appearing in the Figures generally corresponds to the Figure number in which that component is first introduced, such that the same reference number is used throughout to refer to an identical component which appears in multiple Figures.

Description of the System

Figure 1:
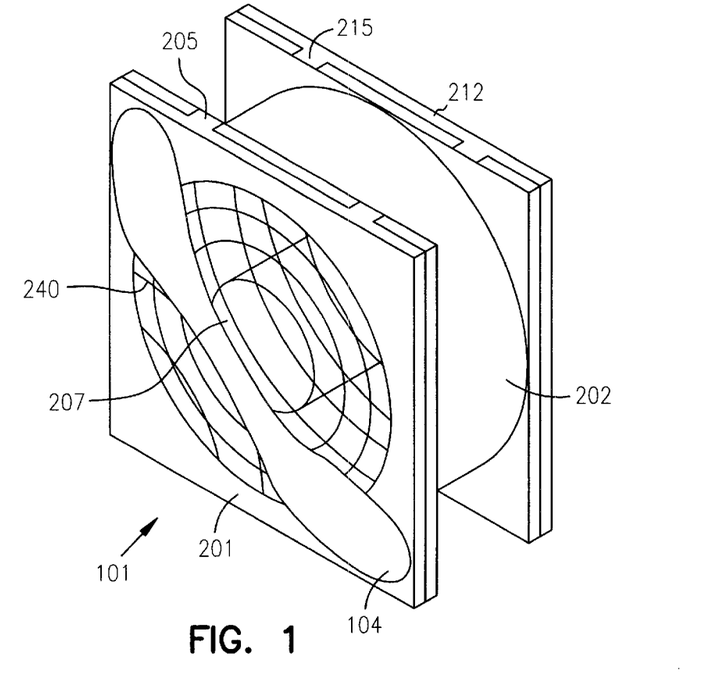
FIG. 1 shows a front isometric view of a fan assembly according to the present invention.
Figure 2:
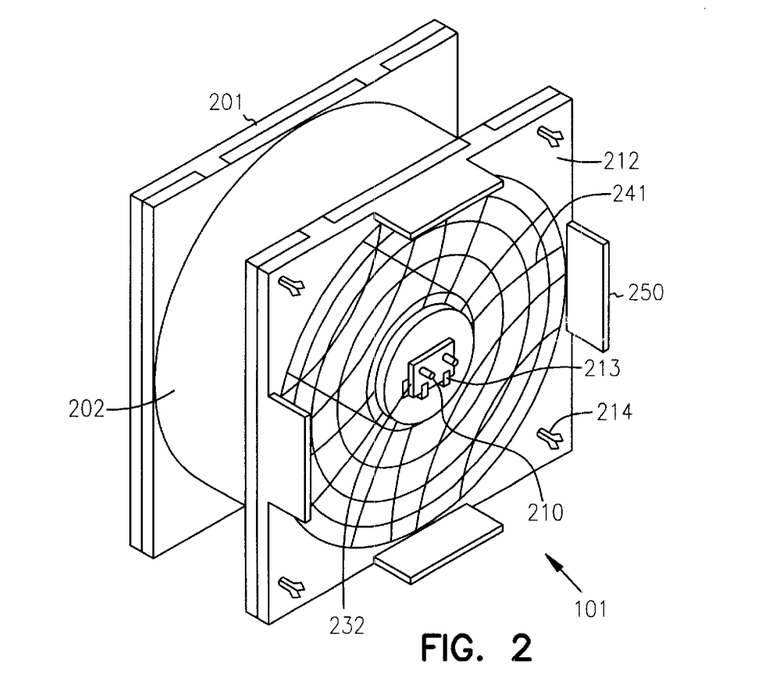
FIG. 2 shows a back isometric view of FIG. 1.
Figure 5:
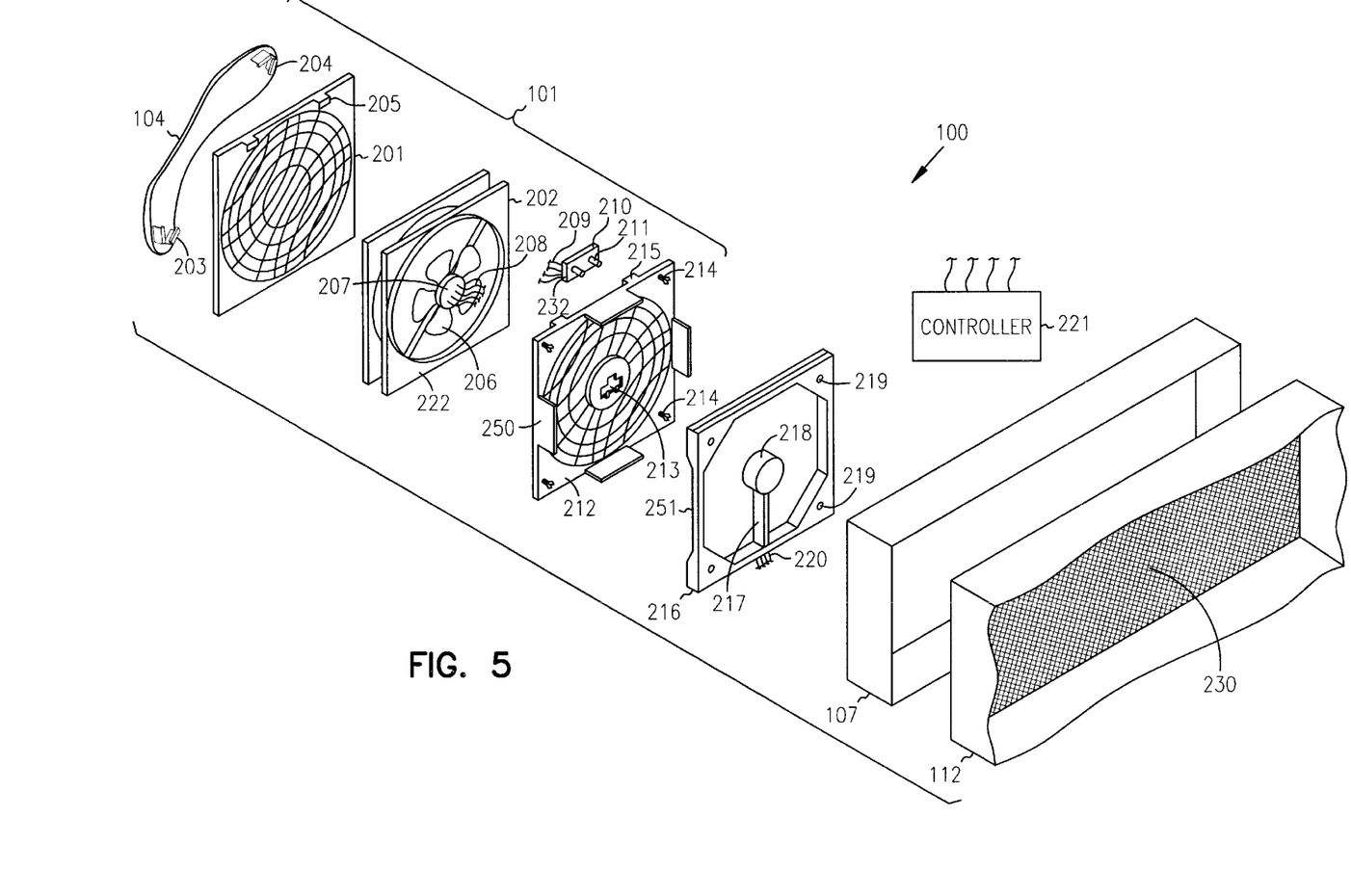
FIG. 5 shows an exploded view of the system of FIGS. 3 and 4.

FIGS. 1, 2, and 5 show one embodiment of a fan assembly 101. FIGS. 1 and 2 show a front and a back isometric view of fan assembly 101. FIG. 5 partially shows an exploded view of FIGS. 1 and 2. Fan assembly 101 includes a front finger guard 201, an air mover such as a fan 202, and a rear finger guard 212. Front finger guard 201 contains a plurality of finger guards 240 which prevent a user's fingers from coming in contact with fan 202. Attached to the front side of finger guard 201 is a handle 104. In one embodiment, handle 104 is attached at two diagonally opposite corners of front finger guard 201. In one embodiment, handle 104 is shaped to provide a grip for a hand so that a user can pull or push on handle 104 to remove or attach fan assembly 101 to a mating connection. Embodiments of handle 104 will be described in further detail below.

Referring to FIG. 5, air mover or fan 202 includes an outer casing 222. Within casing 222 the fan includes a fan hub 207. Attached to hub 207 are a plurality of blades 206. Fan 202 also includes a plurality of electric wires 208 for providing power, speed control, and sensing to and from the fan. Those skilled in the art will appreciate that any type of fan or other air moving apparatus can be used within the present system, and that the present invention is not limited by the type of fan described.

In one embodiment, front finger guard 201 includes clips 205 for attaching front finger guard 201 to a front side of fan 202. In one such embodiment, front finger guard 201 includes two clips 205 located on an upper side of front guard 201, and two clips 205 located on a bottom side of the finger guard. Clips 205 permit a user to attach front finger guard to fan 202 without the need to use any separate fasteners.

Fan assembly 101 also includes a fan connector 210. Fan connector 210 is coupled to the electrical wires 208 from fan 202. Connector 210 contains a connecting latch section 232 and a coupling/mating member 211.

In the embodiment shown in FIG. 5, fan assembly 101 includes a rear finger guard 212. In one such embodiment, rear finger guard 212 is approximately the same size as front finger guard 201 and it is attached to the rear side of the fan 202. Rear finger guard 212 contains a plurality of finger guards 241 which prevent a user's fingers from coming in contact with blades 206 of fan 202. Rear finger guard 212 also contains clips 215 for clipping rear finger guard 212 to the back side of fan 202. Clips 215 are positioned analogously to front finger guard clips 205.

Rear finger guide 212 also contains a plurality of guiding members or guiding posts 214. In one embodiment, four guiding members 214 are attached to rear finger guard 212 substantially in the four corners thereof. Guiding members 214 are bi-directional latching members. This provides that if enough pressure is applied to them while they are being pushed or pulled the guiding members will tend to unlatch from where they are attached. Furthermore, it permits the fan assembly to be installed without using separate fasteners, either electrical or mechanical. This minimizes the complexity and time needed to mount the fan to its mating connection.

Figure 9:
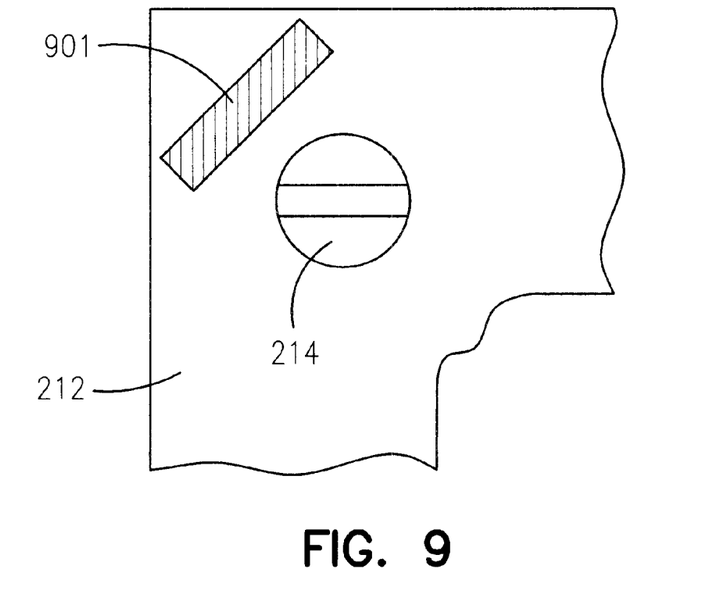
FIG. 9 shows one embodiment of a guide tab for a rear finger guard according to the present invention.
Figure 10:
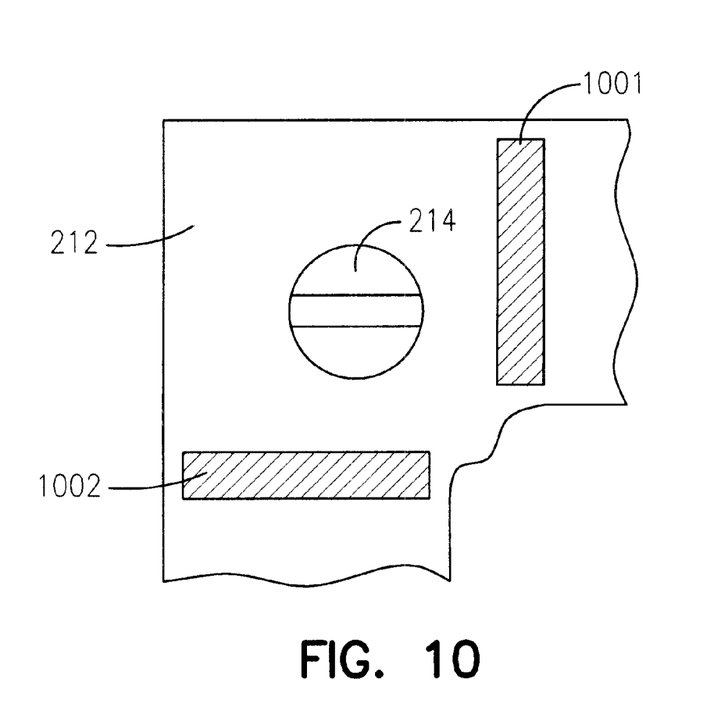
FIG. 10 shows another embodiment of a guide tab for a rear finger guard according to the present invention.

Rear finger guard 212 also includes an opening (latching hole 213) situated approximately in a central portion of guard 212. Latching hole 213 is adapted to lockably mate with connecting latch section 232 of fan connector 210, as shown in FIG. 2. In one embodiment, latching hole 213 includes tabs for supporting and attaching fan connector 210 firmly to the rear finger guard. In one embodiment, rear finger guard 212 also includes a plurality of guide/support tabs 250 on an outer surface of the guard. Tabs 250 are adapted to mate with opposing slots such as slots 251 and 252 on the mating panel. Alternatively, as shown in FIGS. 9 and 10, rear finger guard 212 can include guide/support tabs 901 situated diagonally in a corner of the finger guard, or guide/support tabs 1001 and 1002 which are perpendicular to the sides of the finger guard and lay at right angles to one another on adjacent sides of guide member 214.

Figure 6:
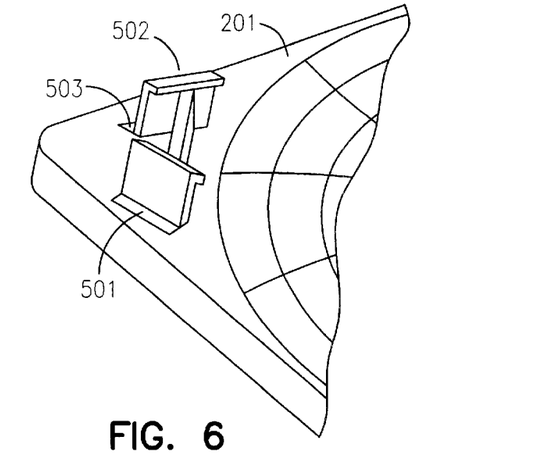
FIG. 6 shows an isometric view of a corner section of a front finger guard according to the present invention.
Figure 7:
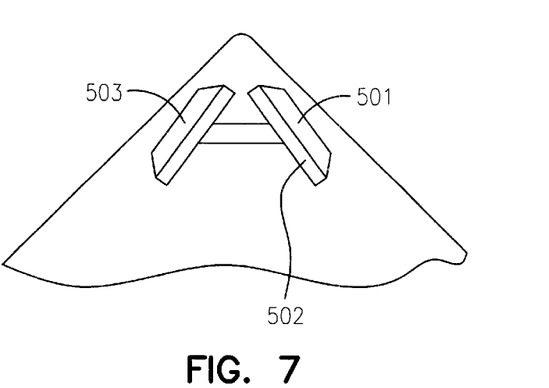
FIG. 7 shows a top view of the modified H-shaped section of FIG. 6.
Figure 8:
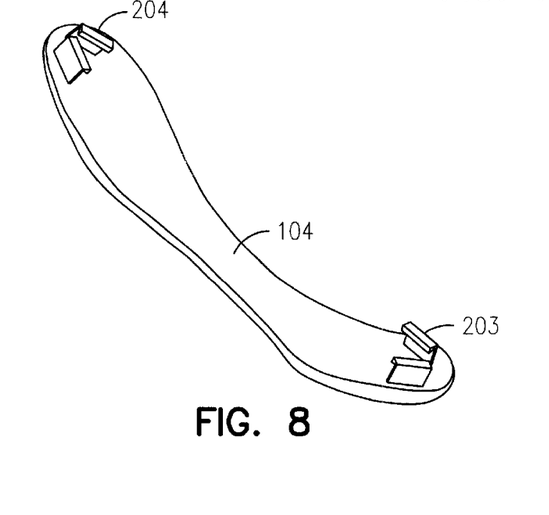
FIG. 8 shows one embodiment of a handle according to the present invention.

FIGS. 6–8 show one embodiment of handle 104 and an attaching section 502 on front finger guard 201. FIG. 6 shows an outside isometric view of a corner section of front finger guard 201. Front finger guard 201 contains a modified H-shaped section 502 having an opening 501 on one side and an opening 503 on an opposite side. The shape of section 502 is adapted to match the shape of the underside of handle 104. Handle 104 has a first set of angled snaps 203 on one end and a second set of angled snaps 204 on an opposite end. When snaps 203 or 204 are inserted into openings 501 and 503, the snaps become attached. The modified H-shape helps spread the force of handle 104 so it is not localized only where the snaps attach to front finger guard 201. This permits a user to use enough force to insert and remove fan assembly 101 from mating panel 216, while not taking up too much space in front of fan assembly 101, which would decrease airflow.

One exemplary method of assembling fan assembly 101 is as follows. Handle 104 is attached to front finger guard 201. Front finger guard 201 is then attached to fan 202. Fan connector 210 is coupled to the wires 208 of the fan. Fan connector 210 is then locked into place within hole 213 of rear finger guard 212, and the rear finger guard is attached to the rear side of fan 202. The fan assembly is then ready to be matably connected to the system.

In one embodiment, no finger guards are provided. In one such embodiment (not shown), guiding members extend from outer casing 222 and fan connector 210 is attached to hub 207 through mechanical or adhesive means. In addition, in one such embodiment (also not shown), slots are provided on the front side of outer casing 222. The slots are used in one embodiment to permanently attached a handle thereto. In another embodiment, a temporary handle can be attached to outer casing 222 to facilitate inserting and removing fan assembly 201.

Figure 3:
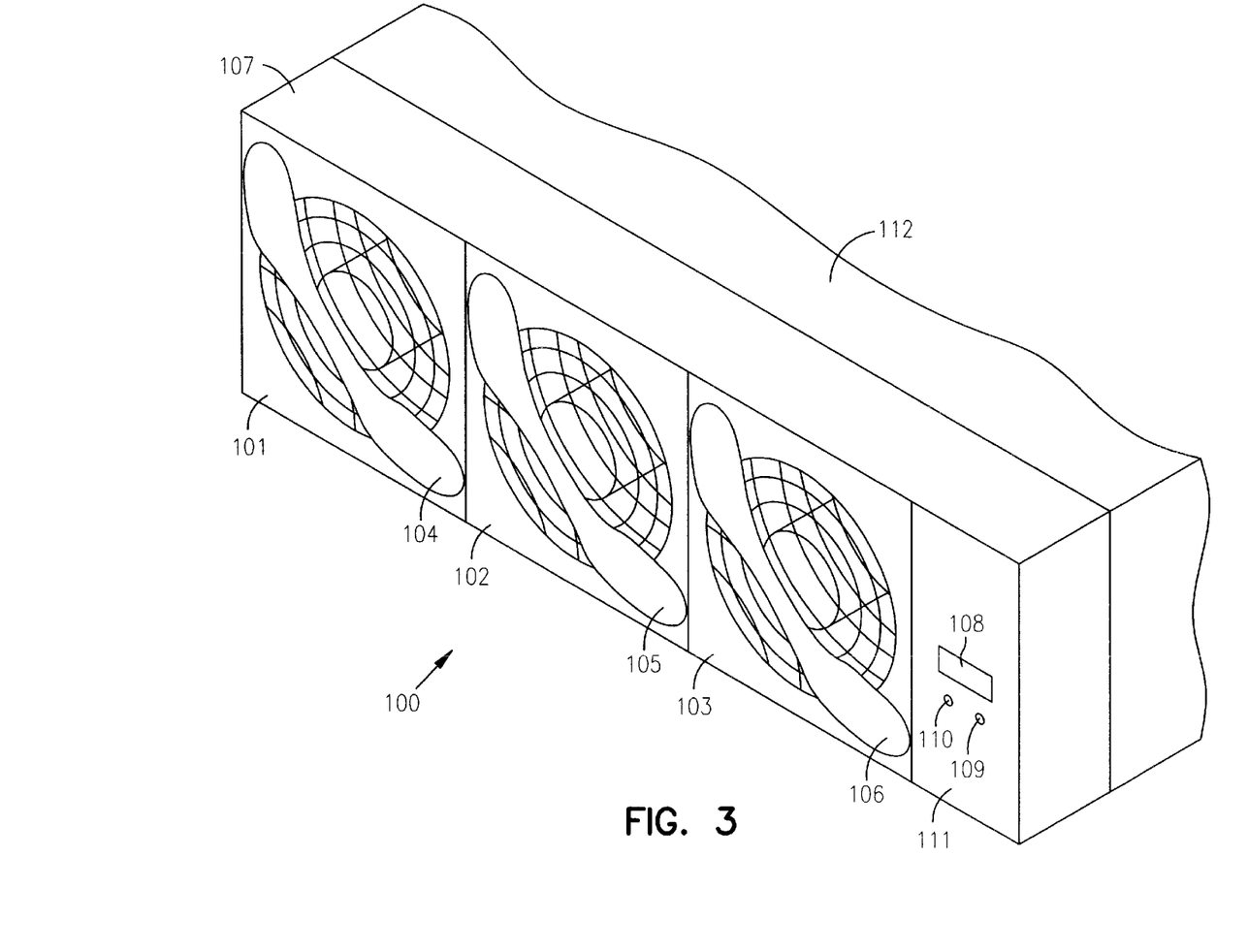
FIG. 3 shows one embodiment of a modular air moving system according to the present invention.
Figure 4:
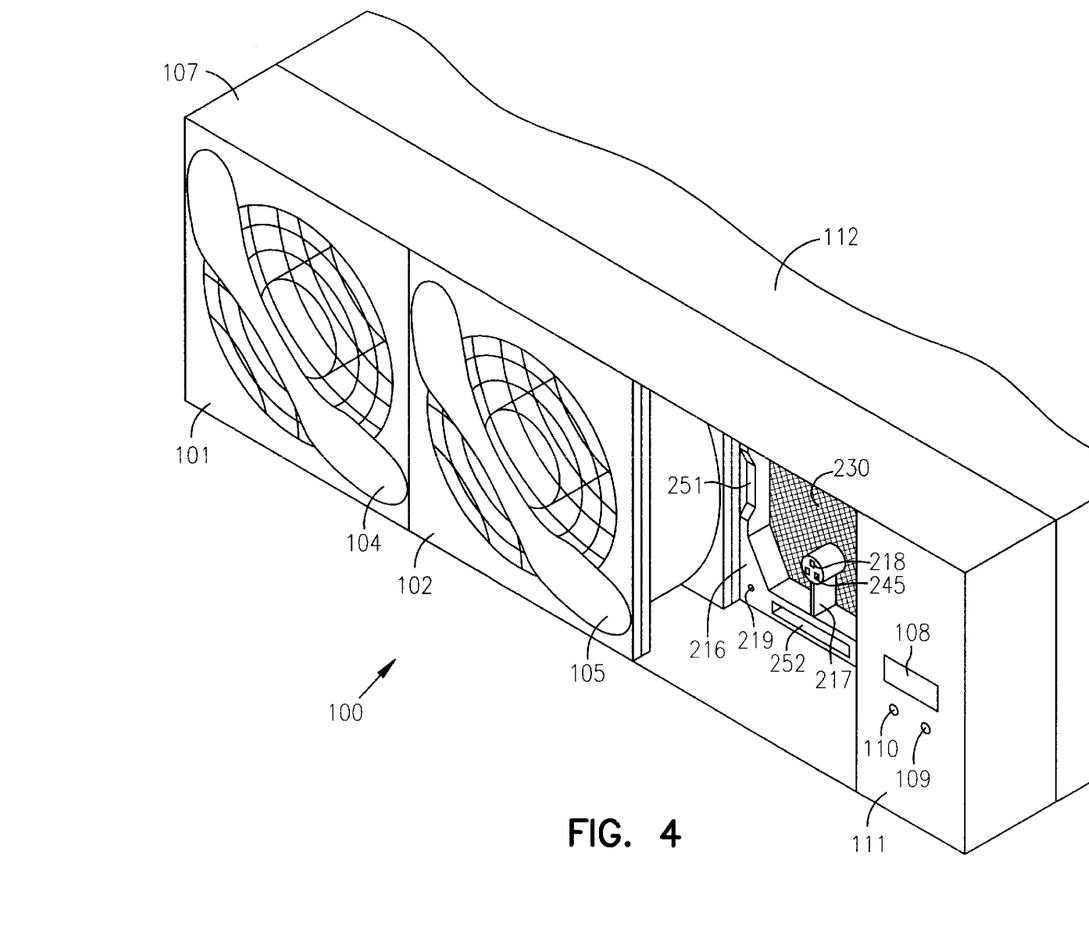
FIG. 4 shows the modular air moving system of FIG. 3 with a fan assembly removed.

FIGS. 3–5 show one embodiment of an exemplary modular air moving system 100 which includes fan assembly 101. System 100 is described in the context of air cooling an electronic computer system. However those skilled in the art will recognize that the present system is not limited by the environment in which it is used but instead could be used, for example, in other types of electronic systems.

System 100 includes a supporting structure such as a sheet metal fan enclosure unit 107. In this exemplary embodiment, fan enclosure unit 107 is EIA standard 19" wide and is designed for fitting onto a standard 19" computer system rack. Fan enclosure unit 107 is adapted to be mounted against the front side 230 of an enclosure 112, which contains a plurality of electronic devices or other heat generating components including, but not limited to, processors, disk drives, memory chips, and/or other electronic components. The front side of enclosure 112 contains a plurality of perforated holes. Alternatively, enclosure 112 can include slits or other means to permit the air to be directed to the heat generating components. At least one other side of enclosure 112 also contains a plurality of slits or holes, thus permitting the flow-through of air.

In one embodiment, the perforations in enclosure 112 are designed to permit relatively free flow of air while providing a degree of electromagnetic shielding.

In one embodiment, fan assemblies 101, 102, and 103 are removably mounted within fan enclosure unit 107. In one such embodiment, fan assemblies 101–103 are interchangeable and are equivalent to fan assembly 101 described above. In the embodiment shown in FIGS. 3–5, fan assemblies 101–103 are approximately 5" square. This permits three of the fan assemblies to be used within the 19" EIA standard width. Since the fans are mounted on the outside of the box, the system does not have to be shut down to replace the fans. Instead a worker can hot swap new fans for defective ones. In addition, since no dangerous electronics are exposed outside of enclosure 112, no special training is required to maintain the cooling system. Therefore, even a non-technical worker can do maintenance for the cooling system.

In one embodiment, system 100 includes a controller section 111. In one such embodiment, controller section 111 includes a controller 221 and/or programmable logic circuits which enable the fans to be monitored and controlled. Those skilled in the art will recognize that controller section 111 can also include other logic circuits and controllers to control and monitor other parts of system 100. In one embodiment, controller section 111 also includes a display 108, a first warning/failure light 109, and a second warning/failure light 110. The controller 221 inside controller section 111 monitors fan assemblies 101, 102 and 103. When a fan fails or begins to fail, the controller causes one of the lights 109 and 110 to light, and it causes a message detailing the problem to be displayed on display 108. For example, if fan assembly 101 was told to run at a certain speed and controller 221 detected that it was running at a lower speed, then the controller would cause a light to flash and a message such as "center fan running slow" to be output to the display 108a maintenance worker would notice the warning light, read the message, and replace fan assembly 101 with a new fan assembly equivalent to fan assembly 101. The system permits non-technical maintenance workers to diagnose problems and replace the fans, thus not requiring highly paid specialists to do preventive and/or corrective maintenance. Controller 221 also can be programmed to send warning and failure messages to a system having central monitoring software. This would permit remote diagnosis of the system.

In one embodiment, a fan assembly receptacle such as a mating panel 216 is mounted flush against perforated outside wall 230 of enclosure 112 and each fan assembly 101, 102, and 103 is removably mounted to the fan assembly receptacle. In one embodiment, one or more mating panels 216 are attached directly to enclosure 112 such that the mating panels are substantially flush with perforated wall 230.

In another embodiment, each mating panel is mounted within a fan enclosure unit 107 and fan enclosure unit 107 is placed substantially flush with the perforated wall 230. In such an embodiment, no mounting holes need to be drilled into enclosure 112 containing the electronic system. This means that no radio waves can leak out of the electronics system through the relatively large holes such a mounting system would require.

In one embodiment, mating panel 216 has a square-shaped frame and includes a plurality of mating guide holes 219, and guiding slots 251 and 252. In one such embodiment, mating panel 216 includes four mating guide holes 219 located in approximately the four corners of its frame. Mating guide holes 219 are configured to matably receive guiding members 214 of rear finger guard 212. In one embodiment, mating guide holes 219 have a slight conical shape, wherein the front opening is larger than the rear opening. This permits guiding members 214 to be slightly misaligned when the fan assembly is being mounted within fan enclosure unit 107. This permits a blind mating connection since the installer does not have to see the connector as they are trying to mount the fan assembly. As explained above, this greatly decreases the need for a specialist to do the maintenance for the system.

In one embodiment, mating panel 216 also includes a post 217 rising from a portion of the mating panel frame. In one such embodiment, post 217 includes a hollow portion running lengthwise inside its body. This permits electrical wires 220, which originate at controller 221, to run upwards therethrough. In one embodiment, only a single post 217 is attached to each panel 216. By using a single post 217, the present system decreases interference to air flow. Attached to the upper end of post 217 is a mating connector such as panel connector 218. Wires 220 terminate in panel connector 218.

Panel connector 218 is situated in approximately a central portion of mating panel 216 and it provides a mating connection that removably couples with fan connector 210. In one embodiment, mating panel 216 includes a latching section 245 having tabs which provide support and attachment for the mating panel connector 218. Since it is mounted in the center of panel 216 at the same level and coaxial with fan hub 207, the connector 218 only minimally interferes with airflow. Also, since it is located in the center of frame 216, it saves space compared with being mounted outside the perimeter of the fan assembly. This provides that three 5"×5" fans can be used in air moving system 100 and still be within the EIA 19" standard width. Thus, the system provides optimized airflow in a minimal space.

In one embodiment, read finger guard 212 and mating panel 216 are designed such that when fan assembly 101 is snapped into place, a closed tube extends from fan 202 to the front of enclosure 112. In such an embodiment, even if a fan assembly is removed (such as in FIG. 2), the air being pushed by the other two fans is still directed into the enclosure 112. This is because the fans are mounted in parallel, and each mating panel provides a channel for air to go through.

Exemplary Operation of the System

In one exemplary embodiment of using system 100, mating panel 216 is mounted against a box or structure containing heat generating components, such as enclosure 112. Mating panel 216 is attached to fan enclosure unit 107 or an equivalent supporting structure. This supporting structure permits mating panel 216 to be mounted against the wall of enclosure 112 without being attached to it. Wires 220 from the system are run up post 220 to a mating connector such as panel connector 218. Connector 218 is adapted to be matably connectable to fan connector 210. Wires 220 are also coupled to a controller 221 contained in a controller section 111 of the system. The controller 111 is for sensing, monitoring, and controlling the fan.

The fan assembly is then mounted against mating panel 216. Guide members 214 on rear finger guard 212 provide guidance into mating guide holes 219 on the mating panel. The fan assembly is then inserted into position, and fan connector 210 mates with panel connector 218.

If replacement of the fan is required, then controller 221 senses this requirement and displays a warning/failure light on light 109 or 110 and a message on display 108a person can read the message to diagnose the problem. If, for example, the message reads, "replace central fan," the person grips handle 104 and pulls the fan assembly out away from the mating panel. The bi-directional guiding members 214 permit the unit to unlatch from its attached position. The front finger guards and rear finger guards protect the person's hands from any danger. Also, since the fan is outside the box, the person does not have to shut down the electronics within the box to remove the fan since there is no electrical danger outside of the box.

The person takes an equivalent fan assembly and mounts it in the failed fan's former position, as described above. If the system is a three-fan system, as shown in FIGS. 3 and 4, the short time that the fan is removed does not cause any harm to the system. This is because the fan can be replaced quickly, and because the fans are mounted in a parallel configuration so that each fan assembly's mating panel provides an airflow channel to the inside of the box.

It should be noted that, although in the above examples fan 202 is placed to blow air into enclosure 112, fan 202 could be configured to suck air out of enclosure 112.

CONCLUSION

The present system provides a system and method for efficiently directing air past components of a heat generating system. The system permits fan replacement by nontechnical workers, permits fan replacement while the electronics system is still running, and provides a required volume of air movement using minimal space. The result is increased reliability, reduced cost, and enhanced ease of use.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A fan assembly, comprising:
    a fan having a front and a back side, wherein the fan rotates about a center;
    an electrical connector attached to the back side of the fan proximate to said center; and
    one or more guide members;
    wherein the guide members are configured to guide the electrical connector into a mating connection.

2. The fan assembly of claim 1, wherein the mating connection comprises a mating connector attached to a mating panel, the fan connector removably couplable with the mating connection.

3. The fan assembly of claim 2, wherein the fan further includes a hub and wherein the electrical connector is attached behind the hub.

4. The fan assembly of claim 2, wherein the fan further includes a rear finger guard mounted on the back side of the fan, wherein the electrical connector extends through the rear finger guard.

5. The fan assembly of claim 4, wherein the one or more guide members extend back from the rear finger guard.

6. The fan assembly of claim 1, wherein the fan further includes a front finger guard.

7. The fan assembly of claim 6, wherein the fan assembly further includes a handle coupled to the front finger guard.

8. The fan assembly of claim 7, wherein the handle includes a set of snaps and wherein the front finger guard includes a modified H-shaped section couplable with the set of snaps.

9. The fan assembly according to claim 7, wherein the handle is formed through plastic injection molding.

10. The fan assembly according to claim 1, wherein the front side of the fan includes a handle, wherein the handle facilitates inserting and extracting the fan assembly from the mating connection.

11. A fan assembly, comprising:
    a fan having a front side and a back side, wherein the fan includes fan control wires;
    a fan connector attached to the back side of the fan and located behind a hub of the fan, wherein the fan connector is electrically connected to the fan control wires; and
    one or more guide members, wherein the guide members are configured to guide the fan connector into an electrical connection with an electronic assembly.

12. The fan assembly according to claim 11, wherein the front side of the fan includes a handle, wherein the handle facilitates inserting and extracting the fan assembly from the electrical connection.

13. A fan assembly, comprising:
    a fan having a front and a back side, wherein the fan rotates about a center;
    an electrical connector attached to the back side of the fan proximate to said center;
    one or more guide members which are configured to guide the electrical connector into a mating connection, the mating connection including a mating connector attached to a mating panel, wherein the fan connector is removably couplable with the mating connection; and
    a rear finger guard mounted on the back side of the fan, wherein the electrical connector extends through the rear finger guard.

14. The fan assembly of claim 13, wherein the one or more guide members extend back from the rear finger guard.

15. The fan assembly of claim 13, wherein the fan further includes a hub and wherein the electrical connector is attached behind the hub.

16. A fan assembly, comprising:
    a fan having a front and a back side, wherein the fan rotates about a center;
    an electrical connector attached to the back side of the fan proximate to said center;
    one or more guide members which are configured to guide the electrical connector into a mating connection;
    a front finger guard on the front side of the fan; and
    a handle coupled to the front finger guard, wherein the handle includes a set of snaps and wherein the front finger guard includes a modified H-shaped section couplable with the set of snaps.

17. The fan assembly according to claim 16, wherein the handle is formed through plastic injection molding.

18. A fan assembly, comprising:
    a fan having a front and a back side, wherein the fan rotates about a center; and
    an electrical connector attached to the back side of the fan and removably couplable with a mating connection, wherein the electrical connector is positioned substantially directly behind said fan center such that when the electrical connector is connected to the mating connection the electrical connector does not substantially interfere with a flow through the fan.

19. The fan assembly of claim 18, wherein the mating connection comprises a mating connector attached to a mating panel.

20. The fan assembly of claim 18, further comprising one or more guide members which are configured to guide the electrical connector into the mating connection.

21. The fan assembly of claim 18, wherein the fan further includes a hub and wherein the electrical connector is attached behind the hub.

* * * * *

UNITED STATES PATENT AND TRADEMARK OFFICE
CERTIFICATE OF CORRECTION

PATENT NO.     : 6,406,257 B1
DATED          : June 18, 2002
INVENTOR(S)    : Philip J. Houdek It is certified that error appears in the above-identified patent and that said Letters Patent is hereby corrected as shown below:

<u>Column 10,</u>
Line 7, after claim No. 21, insert the following as claim No. 22:
-- 22.   A method of connecting a fan to power source, the method comprising: providing a mating panel having a mating connector coupled to a power source; and coupling a fan assembly to the mating panel,
wherein the fan assembly includes a fan having a hub and wherein coupling includes:
    wiring the fan to a fan connector;
    mounting the fan connector along an axial line running through the hub; and
    pressing the hub assembly into the mating panel so as to mate the mating connector and the fan connector. --

Signed and Sealed this

First Day of April, 2003

JAMES E. ROGAN
*Director of the United States Patent and Trademark Office*